*(12)* United States Patent
Du et al.

(10) Patent No.: US 11,417,384 B2
(45) Date of Patent: Aug. 16, 2022

(54) APPARATUSES AND METHODS FOR CONTROL OF REFRESH OPERATIONS

(71) Applicant: MICRON TECHNOLOGY, INC., Boise, ID (US)

(72) Inventors: Bin Du, Shanghai (CN); Liang Li, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/004,235

(22) Filed: Aug. 27, 2020

(65) Prior Publication Data

US 2022/0068361 A1    Mar. 3, 2022

(51) Int. Cl.
*G11C 11/406* (2006.01)
*G11C 11/4076* (2006.01)
*G11C 11/408* (2006.01)

(52) U.S. Cl.
CPC ..... *G11C 11/40611* (2013.01); *G11C 11/4076* (2013.01); *G11C 11/4087* (2013.01)

(58) Field of Classification Search
CPC ........... G11C 11/40611; G11C 11/4076; G11C 11/4087

USPC ....................................................... 365/222
See application file for complete search history.

(56) References Cited

U.S. PATENT DOCUMENTS 10,957,376 B1 * 3/2021 Cheng .................. G11C 11/408
2018/0342282 A1 * 11/2018 Morgan ............ G11C 11/40603

* cited by examiner

*Primary Examiner* — Hoai V Ho
*Assistant Examiner* — Minh Dinh
(74) *Attorney, Agent, or Firm* — Dorsey & Whitney LLP

(57) ABSTRACT

In some examples, a memory device may perform refresh operations responsive to internal and/or external commands. internal refresh commands may include auto-refresh commands and row hammer (e.g., targeted) refresh commands. External commands may include refresh management commands. In some examples, the external command may cause a refresh operation to occur after a number of activation commands. The memory device may monitor row addresses associated with the activation commands. In some examples, the memory device may skip a refresh operation indicated by a refresh management command if none of the row addresses associated with the activation commands occurs at a high frequency. In some examples, row addresses may be determined to be aggressor row addresses if a received row address matches a previously received row address.

14 Claims, 11 Drawing Sheets

APPARATUSES AND METHODS FOR CONTROL OF REFRESH OPERATIONS

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory device as a physical signal (e.g., a charge on a capacitive element). The memory device may include a volatile memory, and the physical signal may decay over time (which may degrade or destroy the information stored in the memory cells). It may be necessary to periodically refresh the information in the memory cells by, for example, rewriting the information to restore the physical signal to an initial value.

As memory components have decreased in size, the density of memory cells has greatly increased. Repeated access to a particular memory cell or group of memory cells (often referred to as a 'row hammer') may cause an increased rate of data degradation in nearby memory cells. Memory cells affected by the row hammer effect may be identified and refreshed as part of a targeted refresh operation performed by the memory device. These targeted refresh operations may take the place of (e.g., steal) time slots which would otherwise be used for a background refresh operation (e.g., auto-refresh). Some memory devices permit external commands to cause the memory device to perform a refresh operation. In some applications, the refresh operations performed responsive to external commands may be in addition to the background and targeted refresh operations. It may be desirable to balance the variety of refresh operations performed by the memory device.

DETAILED DESCRIPTION

Figure 1:
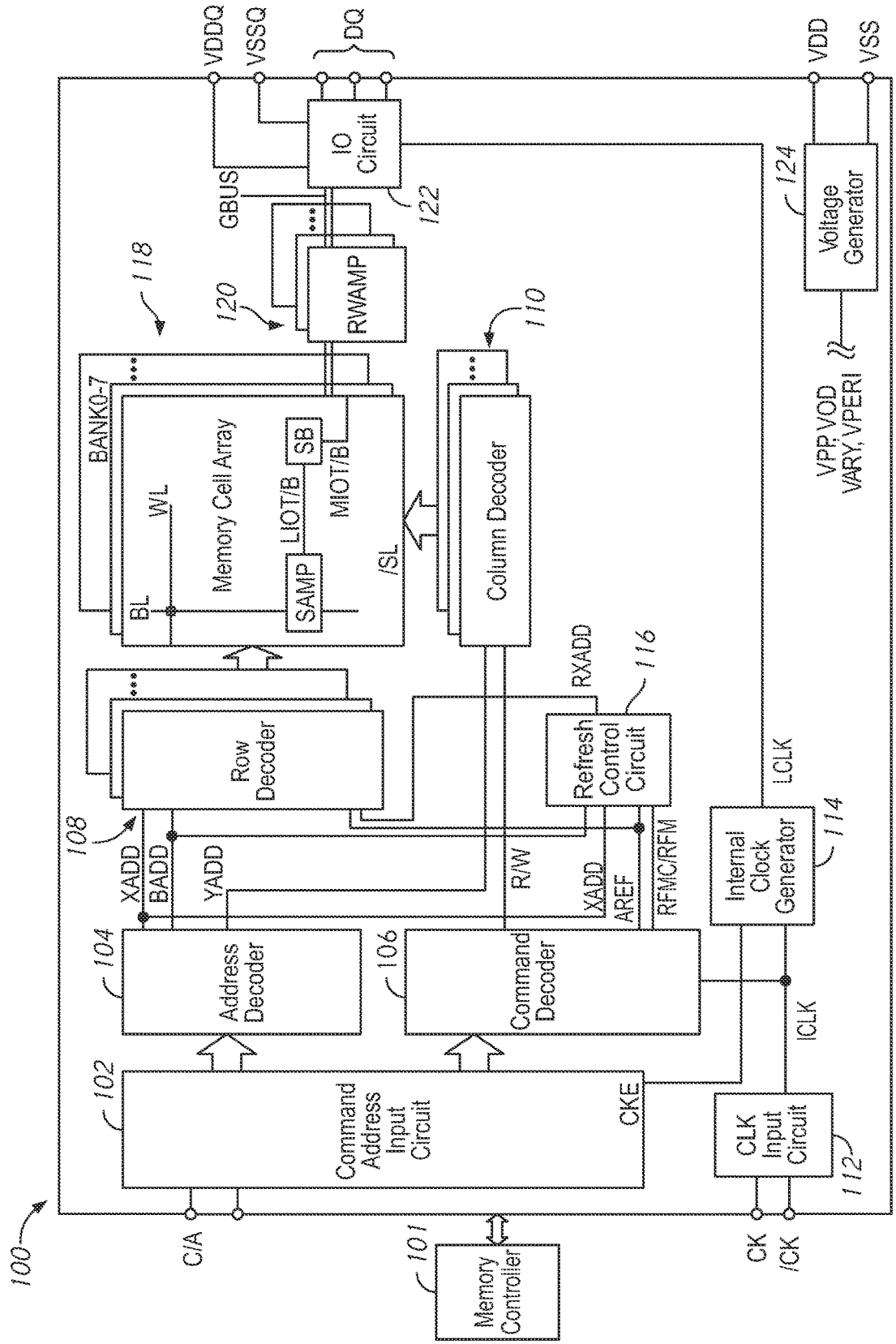
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a volatile memory device may be stored in memory cells (e.g., as a charge on a capacitive element), and may decay over time. The memory cells may be organized into rows (word lines) and columns (bit lines), and the memory cells may be refreshed on a row-by-row basis. In order to prevent information from being lost or corrupted due to this decay, the memory may carry out a refresh process, such as refresh operations as part of a refresh mode. During a refresh operation, information may be rewritten to the word line to restore its initial state. Auto-refresh operations may be performed on the word lines of the memory in a sequence such that over time each of the word lines of the memory are refreshed at a rate faster than the expected rate of data degradation.

Repeated access to a particular row of memory (e.g., an aggressor row) may cause an increased rate of decay in rows (e.g., victim rows) which are close to the aggressor row. These repeated accesses may be part of a deliberate attack against the memory and/or may be due to 'natural' access patterns of the memory. The increased rate of decay in the victim rows may require that they be refreshed as part of a targeted refresh operation. The memory device may periodically perform targeted refresh operations as part of the refresh mode. For example, when the memory device is in a refresh mode it may perform a set of refresh operations including a number of auto-refresh operations, and a number of targeted refresh operations and then repeat this cycle. In some embodiments, the targeted refresh operations may 'steal' timeslots which would otherwise be used for auto-refresh operations. A memory device may generally cycle between performing access operations for a period of time, entering a refresh mode for a period of time, performing access operations and so forth.

If a memory begins receiving access requests (e.g., activation commands) at a very high rate, it may indicate that an attack against the memory is occurring and it may be desirable to perform a refresh operation even when the device is not in a refresh mode (e.g., performing an auto-refresh or a targeted refresh). Based on a number of access commands (e.g., on a bank-by-bank basis), an additional refresh request command may be issued which may lead to additional refresh operations being performed while the memory is not in the refresh mode. These additional refresh requests may be initiated and/or configured based on external commands provided to the memory. For example, a memory controller may count a number of access commands provided to the memory and provide a command/signal indicating an additional refresh operation should be performed. In another example, an external command, referred to as a refresh management (RFM) command, may indicate a number of access requests after which an additional refresh operation should be performed. (e.g., perform a refresh operation after every 120 access requests). The additional refresh operations may be referred to as RFM refresh operations. The rows selected for refreshing during a RFM refresh operation (e.g., victim row) may be determined in the same manner or in a different manner than the rows selected for refreshing during a targeted refresh operation.

However, high rates of access requests do not always correspond to attacks on the memory. For example, if none of the word lines are accessed at a high frequency (e.g., many different word lines are accessed during the high rate of access requests), data in adjacent word lines may not require additional refreshing to prevent degradation. In these cases, some or all of the RFM refresh operations may not be necessary to preserve data in the memory cells. In some cases, the unnecessary RFM refresh operations may diminish performance of the memory device. In some cases, the unnecessary RFM refresh operations may cause the refreshed word lines to become secondary aggressor word lines. That is, the RFM refresh operations may act as a secondary row hammer attack on the refreshed word lines. Thus, it may be desirable to manage RFM refresh operations to reduce unnecessary refresh operations.

According to an embodiment of the present disclosure, some RFM refresh operations may be skipped by the memory based, at least in part, on a frequency at which row addresses are received. In some embodiments, the row addresses provided with associated access requests may be monitored to determine whether one or more row addresses are accessed at a frequency high enough that the word line associated with the row address is an aggressor row (e.g., there is a risk of increased data degradation in adjacent word lines). In some embodiments, a high-pass filter may be used to determine whether a row address is associated with an aggressor row. The cut-off frequency of the high-pass filter may determine whether a row address is determined to be an aggressor row address. For example, row addresses received at a frequency below the cut-off frequency may be determined to not be aggressor row addresses whereas row addresses received at a frequency equal to or greater than the cut-off frequency may be determined to be aggressor row addresses. In some embodiments, a row address may be determined to be received at or above the cut-off frequency if the row address is received at a rate of more than once within a number of sequential access requests.

If none of the row addresses associated with access requests are determined to be aggressor rows, an RFM refresh operation may be skipped. That is, a RFM signal indicating a RFM refresh operation (received external from the memory or generated internally based on an external RFM command) should be performed may be ignored by the memory.

If one or more row addresses associated with the access requests are determined to be aggressor rows, the RFM refresh operation may be performed. In some embodiments, the row addresses identified as aggressor rows by the high-pass filter may be used to generate refresh addresses for word lines refreshed during the RFM refresh operation.

FIG. 1 is a block diagram of a semiconductor device according to an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 108 and the selection of the bit lines BL and /BL is performed by a column decoder 110. In the embodiment of FIG. 1, the row decoder 108 includes a respective row decoder for each memory bank and the column decoder 110 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 120 over complementary local data lines (LIOT/B), transfer gate (TG), and complementary main data lines (MIOT/13). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder circuit 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder circuit 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed. In some embodiments, the commands and/or addresses may be provided by a component external to the device 100, for example, as shown in FIG. 1, a memory controller 101 in communication with the device 100.

The commands may be provided as internal command signals to a command decoder circuit 106 via the command/address input circuit 102. The command decoder circuit 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder circuit 106, which provides internal commands so that read data from the memory array 118 is provided to the read/write amplifiers 120. The read data is output to outside from the data terminals DQ via the input/output circuit 122.

The device 100 may receive an access command which is a write command. When the write command is received, and a bank address, a row address and a column address are timely supplied with the write command, write data supplied to the data terminals DQ is written to a memory cells in the memory array 118 corresponding to the row address and column address. The write command is received b and decoder circuit 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The device 100 may also receive commands causing it to carry out one or more refresh operations as part of a self-refresh mode. The device 100 may be periodically placed in a refresh mode. Thus, refresh operations may be performed periodically each time the memory device is in the refresh mode. In some embodiments, the refresh mode command may be externally issued to the memory device 100. In some embodiments, the refresh mode command may be periodically generated by a component of the device. In some embodiments, when an external signal indicates a refresh mode entry command, the refresh signal AREF may also be activated. The refresh signal AREF may be a pulse signal which is activated when the command decoder circuit 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the refresh mode. A self-refresh exit command may cause the automatic activation of the refresh signal AREF to stop and may cause the device 100 to return to an idle state and/or resume other operations.

The refresh signal AREF is supplied to the refresh control circuit 116. The refresh control circuit 116 supplies a refresh row address RXADD to the row decoder 108, which may refresh one or more word lines WL indicated by the refresh row address RXADD. In some embodiments, the refresh address RXADD may represent a single word line. In some embodiments, the refresh address RXADD may represent multiple word lines, which may be refreshed sequentially or simultaneously by the row decoder 108. In some embodiments, the number of word lines represented by the refresh address RXADD may vary from one refresh address to another. The refresh control circuit 116 may control a timing of the refresh operation, and may generate and provide the refresh address RXADD. The refresh control circuit 116 may be controlled to change details of the refreshing address RXADD (e.g., how the refresh address is calculated, the timing of the refresh addresses, the number of word lines represented by the address), or may operate based on internal logic.

The refresh control circuit 116 may selectively output a targeted refresh address (e.g., which specifies one or more victim address based on an aggressor) or an automatic refresh address (e.g., from a sequence of auto-refresh addresses) as the refresh address RXADD. Based on the type of refresh address RXADD, the row decoder 108 may perform a targeted refresh or auto-refresh operation. The automatic refresh addresses may be from a sequence of addresses which are provided based on activations of the refresh signal AREF. The refresh control circuit 116 may cycle through the sequence of auto-refresh addresses at a rate determined by AREF. In some embodiments, the auto-refresh operations may generally occur with a timing such that the sequence of auto-refresh addresses is cycled such that no information is expected to degrade in the time between auto-refresh operations for a given word line. In other words, auto-refresh operations may be performed such that each word line is refreshed at a rate faster than the expected rate of information decay.

As used herein, an activation of a signal may refer to any portion of a signal's waveform that a circuit responds to. For example, if a circuit responds to a rising edge, then a signal switching from a low level to a high level may be an activation. One example type of activation is a pulse, where a signal switches from a low level to a high level for a period of time, and then back to the low level. This may trigger circuits which respond to rising edges, falling edges, and/or signals being at a high logical level.

The refresh control circuit 116 may also determine targeted refresh addresses which are addresses that require refreshing (e.g., victim addresses corresponding to victim rows) based on the access pattern of nearby addresses (e.g., aggressor addresses corresponding to aggressor rows) in the memory array 118, The refresh control circuit 116 may use one or more signals of the device 100 to calculate the targeted refresh address. For example, the refresh address RXADD may be a calculated based on the row addresses XADD provided by the address decoder.

In some embodiments, the refresh control circuit 116 may sample the current value of the row address XADD provided by the address decoder 104 along a row address bus, and determine a targeted refresh address based on one or more of the sampled addresses. The sampled addresses may be stored in a data storage unit of the refresh control circuit. When a row address XADD is sampled, it may be compared to the stored addresses in the data storage unit. in some embodiments, the aggressor address may be determined based on the sampled and/or stored addresses. For example, the comparison between the sampled address and the stored addresses may be used to update a count value (e.g., an access count) associated with the stored addresses and the aggressor address may be calculated based on the count values. The refresh addresses RXADD may then be used based on the aggressor addresses.

While in general the present disclosure refers to determining aggressor and victim word lines and addresses, it should be understood that as used herein, an aggressor word line does not necessarily need to cause data degradation in neighboring word lines, and a victim word line does not necessarily need to be subject to such degradation. The refresh control circuit 116 may use some criteria to judge whether an address is an aggressor address, which may capture potential aggressor addresses rather than definitively determining which addresses are causing data degradation in nearby victims. For example, the refresh control circuit 116 may determine potential aggressor addresses based on a pattern of accesses to the addresses and this criteria may include some addresses which are not aggressors, and miss some addresses which are. Similar victim addresses may be determined based on which word lines are expected to be effected by aggressors, rather than a definitive determination of which word lines are undergoing an increased rate of data decay.

The refresh address RXADD may be provided with a timing based on a timing of the refresh signal AREF. During the periodic refresh operations of a refresh mode, the refresh control circuit 116 may have time slots corresponding to the timing of AREF, and may provide one or more refresh addresses RXADD during each time slot. In some embodiments, the targeted refresh address may be issued in (e.g., "steal") a time slot which would otherwise have been assigned to an auto-refresh address. In some embodiments, certain time slots may be reserved for targeted refresh addresses, and the refresh control circuit 116 may determine whether to provide a targeted refresh address, not provide an address during that time slot, or provide an auto-refresh address instead during the time slot.

The refresh control circuit 116 may use multiple methods to determine the timing of targeted refresh operations. The refresh control circuit 116 may have periodic targeted refresh operations during a refresh mode, where the refresh control circuit 116 performs auto-refresh operations and targeted refresh operations (e.g., by providing a targeted refresh address as the refresh address RXADD) based on a periodic schedule. For example, after entering a refresh mode, the refresh control circuit 116 may perform a certain number of auto-refresh operations, and then perform (e.g., steal) a certain number of targeted refresh operations.

In addition to auto-refresh and targeted refresh operations, the refresh control circuit 116 may also perform refresh management (RFM) refresh operations, which in some applications may be based on access patterns to the bank associated with the refresh control circuit 116. Examples of access patterns include, but are not limited to, a number of access requests (e.g., activation commands) received and a rate of access requests. The device 100 may receive commands which are refresh management commands (e.g., may receive request management commands at the command/address terminal C/A), for example, from memory controller 101. The command decoder circuit 106 may provide a refresh management command signal RFMC based on the refresh management command. In some embodiments, the refresh management command may be the signal RFMC, which may be passed directly to the refresh control circuit 116. In some embodiments, the signal RFMC may configure refresh management circuitry included with the refresh control circuit 116. For example, the signal RFMC may indicate a number of access requests received before an RFM refresh operation is performed (e.g., a threshold value for a number of access requests before a RFM refresh operation is initiated, a RFM refresh mode type). In some embodiments, responsive to the RFMC signal, the refresh control circuit 116 may indicate that a RFM refresh operation should be performed.

In some embodiments, as discussed in more detail with reference to FIGS. 2-4, at least some of the refresh management circuitry may be included with the memory controller 101. For example, the memory controller 101 may count a number of access requests provided to the device 100. In this example, instead of, or in addition to, the RFM command signal RFMC, the device 100 may receive a RFM signal RFM from the memory controller 101.

In some embodiments, these RFM refresh operations may happen outside of a refresh mode. For example, a high rate of accesses to the bank may indicate that an attack is taking place. In some embodiments, the refresh control circuit 116 may monitor the row addresses provided with the access commands. Monitoring the row addresses may include storing the received row addresses and counting a number of times the row addresses are received. Once the count of access commands exceeds a threshold, the RFM refresh operation may be performed when one or more of the row addresses was determined to be received at a frequency above or equal to a cut-off frequency, that is, one or more of the row addresses was determined to be associated with an aggressor row. If none of the row addresses were determined to be received at a frequency above or equal to the cut-off frequency, the RFM refresh operation may be skipped. In some examples, after the RFM refresh operation or the skipping of the RFM refresh operations, the count of access commands and row addresses may be adjusted (e.g., reset to an initial value, reduced). It should be understood that the process of refreshing word lines during a periodic and RFM targeted refresh operation may generally be the same, and the difference may generally be in the timing of when the refreshes are performed.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
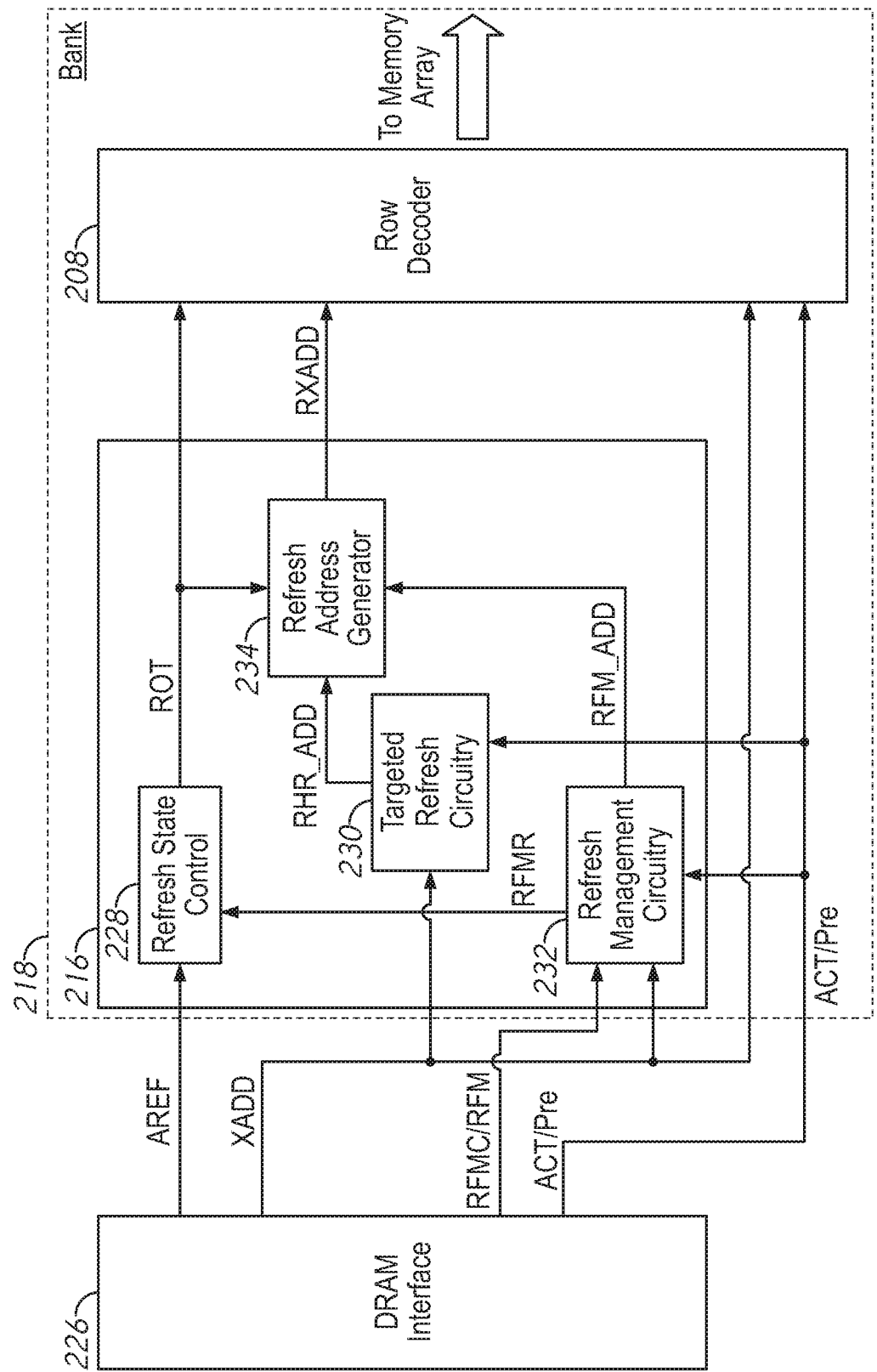
FIG. 2 is a block diagram of a refresh control circuit according to an embodiment of the present disclosure.

FIG. 2 is a block diagram of a refresh control circuit according to an embodiment of the present disclosure. The refresh control circuit 216 may, in some embodiments, be included in the refresh control circuit 116 of FIG. 1. Certain internal components and signals of the refresh control circuit 216 are shown to illustrate the operation of the refresh control circuit 216. The dotted line 218 is shown to represent that in certain embodiments, each of the components (e.g., the refresh control circuit 216 and row decoder 208) may correspond to a particular bank of memory, and that these components may be repeated for each of the banks of memory. Thus, there may be multiple refresh control circuits 216 and row decoders 208. For the sake of brevity, only components for a single bank will be described.

A DRAM interface 226 may provide one or more signals to an address refresh control circuit 216 and row decoder 208. The refresh control circuit 216 may include a refresh state control circuit 228, targeted refresh circuitry 230, refresh management circuitry 232, and a refresh address generator circuit 234. The DRAM interface 226 may provide one or more control signals, such as a refresh signal AREF, a refresh management command signal RFMC, activation and pre-charge signals ACT/Pre, and a row address XADD. The refresh control circuit 216 provides refresh address RXADD with timing based on the refresh signal AREF when the bank associated with the refresh control circuit 216 is in the refresh mode. The refresh control circuit may also provide the refresh address RXADD (and other signals) for a RFM refresh operation.

The DRAM interface 226 may represent one or more components which provides signals to components of the bank. In some embodiments, the DRAM interface 226 may represent a memory controller (e.g., memory controller 101) coupled to the semiconductor memory device (e.g., device 100 of FIG. 1). In some embodiments, the DRAM interface 226 may represent components such as the command address input circuit 102, the address decoder 104, and/or the command decoder circuit 106 of FIG. 1. The DRAM interface 226 may provide a row address XADD, the refresh signal AREF, and access signals such as an activation signal ACT and a pre-charge signal Pre. Although not shown in FIG. 2, the DRAM interface 226 may also provide a bank address BADD, which may indicate which bank the accessed row address XADD is located in. The bank address BADD may activate a particular refresh control circuit 216 associated with the bank indicated by the bank address BADD. The DRAM interface may also put the refresh control circuit into a refresh mode by providing activations of the refresh signal AREF. The refresh signal AREF may be a periodic signal provided during a refresh mode which may indicate a timing for refresh operations. The access signals ACT and Pre may generally be provided as part of an access operation along with a row address XADD. The activation signal ACT may be provided to activate a given bank of the memory. The pre-charge signal Pre may be provided to pre-charge the given bank of the memory. The row address XADD may be a signal including multiple bits (which may be transmitted in series or in parallel) and may correspond to a specific row of an activated memory bank.

The targeted refresh circuitry 230 may include one or more circuits to detect one or more aggressor rows, for example, aggressor rows of a row hammer attack. The targeted refresh circuitry 230 may receive the row address XADD and the ACT/Pre signal from the DRAM interface 226. In some examples, the received row addresses (either sampled addresses or all addresses) may be stored and/or compared to previously stored addresses. The targeted refresh circuitry 230 may provide a match address RHR_ADD based on a current row address XADD and/or previously stored row addresses. In some embodiments, the match address RHR_ADD may, at least some times, correspond to a row address received the most within a time period. The match address RHR_ADD may be provided to the refresh address generator circuit 234 for calculating victim word lines of the aggressor word line associated with the match address RHR_ADD. Examples of suitable circuits for implementing the targeted refresh circuitry 230 may be found in U.S. Pat. No. 9,805,783, U.S. Pat. No. 10,685,696, and U.S. patent application Ser. No. 16/268,818. However, the targeted refresh circuitry 230 is not limited to these examples.

The refresh management (RFM) circuitry 232 may include one or more circuits for determining when a RFM refresh operation should be performed. The RFM circuitry 232 may receive a RFM command signal RFMC which may indicate one or more conditions for determining when the RFM refresh operation should be performed. The RFM circuitry 232 may receive the ACT/Pre signal and count a number of access requests based, at least in part, on a number of times the activation signal ACT is activated. When the count reaches a threshold value (which may be set by the RFMC signal in some embodiments), the refresh management circuitry 232 may activate a RFM refresh (RFMR) signal provided to the refresh state control circuit 228 indicating that an RFM refresh operation should be performed. Once the threshold value is reached, the count value of the access requests may be adjusted (e.g., decremented, reset, set to zero) and the counting of the access requests may continue. In some embodiments, the RFM circuitry 232 may receive the row address XADD. Similar to the targeted refresh circuitry 230, the RFM circuitry 232 may store and/or compare the received row addresses (either sampled addresses or all addresses) to previously stored addresses. In some embodiments, comparing row addresses to previously stored row addresses may be used to determine, at least in part, whether one or more row addresses is an aggressor row.

If it is determined that none of the received row addresses was an aggressor row address (e.g., received at a frequency at or above a cut-off frequency), the refresh management circuitry 232 may not activate the RFMR signal when the count of access requests reaches the threshold value. In some embodiments, even when the RFMR signal is not activated, the count value for the number of access requests may be adjusted. If it is determined that one or more of the received row addresses was associated with an aggressor row, the one or more addresses may be provided as a RFM address RFM_ADD to the refresh address generator circuit 234 and the RFMR signal may be activated. In some embodiments, the row addresses stored by the refresh management circuitry 232 may also be adjusted (e.g., erased, shifted, overwritten) when the threshold value for the access requests is reached and/or the RFMR signal is activated.

As discussed with reference to FIG. 1, in some embodiments, the access requests may be counted by a memory controller, such as memory controller 101, rather than by the refresh control circuit 216. In these embodiments, the refresh management circuitry 232 may receive a RFM signal via the DRAM interface 226. When the refresh management circuitry 232 determines a received row addresses is an aggressor row, the refresh management circuitry 232 may provide the active RFMR signal responsive to the received RFM signal.

The refresh state control circuit 228 may provide a refresh operation type signal ROT to indicate what type of refresh operation should occur (e.g., auto-refresh, targeted refresh, RFM refresh), In some embodiments, ROT may be a multi-bit signal. The state of the ROT signal may be based, at least in part, on the state of the refresh signal AREF and the RFM refresh signal RFMR.

The memory device may carry out a sequence of refresh operations in order to periodically refresh the rows of the memory device as part of a refresh mode. The refresh state control circuit 228 may determine if a given refresh operation is an auto-refresh operation or a targeted refresh operation. The ROT signal may be generated in order to indicate that the device should refresh a particular targeted row (e.g., a victim row) instead of an address from the sequence of auto-refresh addresses. The refresh state control circuit 228 may adjust the state of the ROT signal to cause a sequence of auto-refresh operations and targeted refresh operation to be performed responsive to one or more activations of the refresh signal AREF.

In some embodiments, the refresh control circuit 216 may perform multiple refresh operations responsive to each activation of the refresh signal AREF. :For example, each time the refresh signal AREF is received, the refresh control circuit 216 may perform K different refresh operations, by providing K different refresh addresses RXADD. Each refresh operation may be referred to as a 'pump'. Each of the K different refresh operations may be an auto-refresh operation or a targeted refresh operation. In some embodiments, the number of targeted and auto-refresh operations may be constant in each group of pumps responsive to an activation of the refresh signal AREF. In some embodiments it may vary.

Based on a state of the ROT signal, the refresh address generator circuit 234 may provide a refresh address RXADD, which may be an auto-refresh address, one or more victim addresses corresponding to victim rows of the aggressor row corresponding to the match address RHR_ADD or one or more victim addresses corresponding to the victim rows of the aggressor row (e.g,, high frequency row) corresponding to RFM_ADD. The row decoder 208 may perform a refresh operation responsive to the refresh address RXADD and the refresh operation type signal ROT.

The refresh address generator circuit 234 may receive the match address RHR_ADD from the targeted refresh circuitry 230. The match address RHR_ADD may represent an aggressor row. The refresh address generator circuit 234 may determine the locations of one or more victim rows based on the match address RHR_ADD and provide them as the refresh address RXADD when the signal ROT indicates a targeted refresh operation. In some embodiments, the victim rows may include rows which are physically adjacent to the aggressor row (e.g., RHR_ADD+1 and RHR_ADD−1), In some embodiments, the victim rows may also include rows which are physically adjacent to the physically adjacent rows of the aggressor row (e.g., RHR_ADD+2 and RHR_ADD−2). Other relationships between victim rows and the identified aggressor rows may additionally be used in other examples. For example, +/−3, +/−4, and/or other rows may also be refreshed.

The refresh address generator circuit 234 may receive the RFM address RFM_ADD from the RFM circuitry 232. The RFM address RFM_ADD may represent a row address that was received at or above the cut-off frequency, which may correspond to an aggressor row. The refresh address generator circuit 234 may determine the locations of one or more victim rows based on the RFM address RFM_ADD and provide them as the refresh address RXADD when the signal ROT indicates a RFM refresh operation. Similar to targeted refresh operations, the victim rows may include rows which are physically adjacent to the aggressor row and/or rows that are physically adjacent to the physically adjacent rows of the aggressor row. Other relationships between victim rows and the identified aggressor rows may be used in other examples.

The refresh address generator circuit 234 may determine the value of the refresh address RXADD based on the ROT signal. In some embodiments, when the signal ROT signal indicates an auto-refresh operation, the refresh address generator circuit 234 may provide one of a sequence of auto refresh addresses. When the ROT signal indicates a targeted refresh operation, the refresh address generator circuit 234 may provide a targeted refresh address, such as a victim address, as the refresh address RXADD. In some embodiments, the refresh address generator circuit 234 may count a number of times the ROT signal indicates a targeted refresh operation and may provide closer victim rows (e.g., RHR_ADD+/−1) more frequently than victim rows which are further away from the aggressor address (e.g., RHR_ADD+/−2). When the ROT signal indicates a RFM refresh operation, the refresh address generator circuit 234 may provide an address corresponding to a victim address generated based, at least in part, on the RFM address RFM_ADD (e.g., RFM_ADD+/−1) as the refresh address RXADD.

Alternatively, in some embodiments, the refresh management circuitry 232 may not provide an RFM address RFM_ADD. Instead, the refresh address generator circuit 234 may receive the match address RHR_ADD for generating the refresh address RXADD during RFM refresh operations.

In some embodiments, the RFM refresh operation may be performed responsive, at least in part, to the refresh management circuitry 232 providing the RFMR signal, even if a refresh operation would not otherwise be performed. For example, after providing the signal RFMR, even if the memory device is not currently in a refresh mode, the refresh control circuit 216 may issue the signal ROT to indicate a RFM refresh operation should be performed. In some embodiments, access operations may be put 'on hold' while the memory performs a RFM refresh and access operations may then resume. In some embodiments, the refresh operation type ROT signal may indicate that multiple RFM refresh operations should be performed (e.g., by indicating an RFM refresh operation multiple times). For example, responsive to each activation of the RFM state of the ROT signal, the refresh state control circuit 228 may indicate that two RFM refresh operations should be performed. Other numbers of RFM refresh operations may be performed responsive to each activation in other examples.

The row decoder 208 may perform one or more operations on the memory array (not shown) based on the received signals and addresses. For example, responsive to the activation signal ACT, the row address XADD, and the ROT signal, the row decoder 208 may direct one or more access operations (for example, a read operation) on the specified row address XADD. Responsive to the ROT signal indicating a refresh operation, the row decoder 208 may refresh the refresh address RXADD. It should he understood that the method of actually performing the targeted refresh operation and the RFM refresh operation may generally be the same (e.g., refreshing victim word lines based on a seed address RHR_ADD or RFM_ADD), and the different terminology is meant to distinguish the cause of a particular refresh operation.

Figure 3:
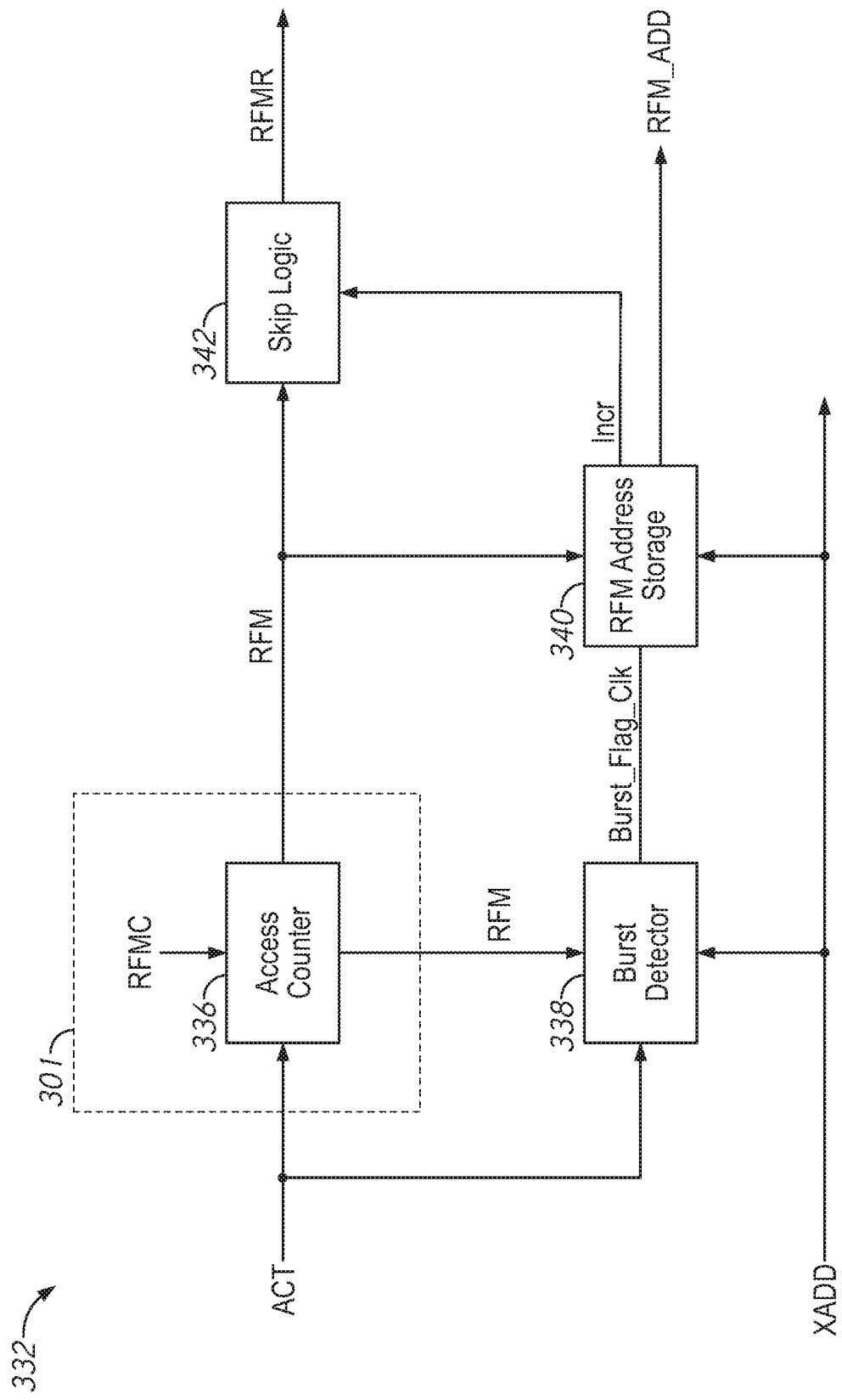
FIG. 3 is a block diagram of refresh management circuitry according to an embodiment of the present disclosure.

FIG. 3 is a block diagram of refresh management circuitry according to an embodiment of the present disclosure. The refresh management circuitry 332 may be included in refresh management circuitry 232 in some embodiments. The refresh management circuitry 300 may include an access counter circuit 336, a burst detector circuit 338, a RFM address storage circuit 340, and a skip logic circuit 342.

The access counter circuit 336 may receive an activation signal ACT. The activation signal ACT may be provided by a command decoder circuit, such as command decoder circuit 106. The access counter circuit 336 may count a number of access requests based, at least in part, on a number of times the activation signal ACT is activated. When the number of access requests reaches a threshold value, the access counter circuit 336 may activate a refresh management signal RFM. In some embodiments, the RFM signal may be a pulse signal that transitions from one logic state es., low) to another logic state e.g., high) for a period of time (e.g., one half or one or more clock cycles) then transitions back to the original logic state (e.g., square wave). In some embodiments, the access counter circuit 336 may be included in a memory controller 301 communicatively coupled to a memory including the other components of the refresh management circuitry 300. In some embodiments, memory controller 301 may be included in memory controller 101.

The burst detector circuit 338 may receive the activation signal ACT and the row address XADD. The burst detector circuit 338 may store and/or compare the received row address XADD to previously received row addresses XADD to determine whether a row address XADD has been received at a frequency at or above a cut-off frequency (e.g., an aggressor row address). In some embodiments, the burst detector circuit 338 may store and/or compare all row addresses XADD. In some embodiments, the burst detector circuit 338 may store and/or compare a sampling of row addresses XADD. The sampling may be based, at least in part, on the activation signal ACT in some embodiments. When the burst detector circuit 338 determines a row address XADD has been received with a frequency at or above the cut-off frequency, the burst detector circuit 338 may activate a burst flag clock signal Burst_Flag_Clk. In some embodiments, the Burst_Flag_Clk signal may be a pulse signal. The burst detector circuit 338 may receive the RFM signal from the access counter circuit 336. In some embodiments, responsive, at least in part, to activation of the RFM signal, one or more components of the burst detector circuit 338 may be adjusted (e.g., reset).

The RFM address storage circuit 340 may receive the row addresses XADD and the Burst_Flag_Clk signal from the burst detector circuit 338. Responsive to activation of the Burst_Flag_Clk signal, the RFM address storage circuit 340 may store the current row address XADD if the current row address is not already stored in the RFM address storage circuit 340. The current row address may correspond to the aggressor row identified by the burst detector circuit 338. When a new address is stored, the RFM address storage circuit 340 may activate an increment signal Incr provided to the skip logic circuit 342. In some embodiments, the increment signal Incr may be a pulse signal. The RFM address storage circuit 340 may receive the RFM signal. Responsive to an active RFM signal, the RFM address storage circuit 340 may provide an RFM address RFM_ADD. In some embodiments, the RFM address RFM_ADD may be provided to a refresh address generator circuit, such as refresh address generator circuit 234.

The skip logic circuit 342 may receive the RFM signal from the access counter circuit 336 and the increment signal Incr from the RFM address storage circuit 340. The skip logic circuit 342 may count how many times the RFM signal and the Incr signal have been received. If the RFM signal has been received an equal number or fewer times than the Incre signal, it may indicate that there are aggressor row addresses stored in the RFM address storage circuit 340 that have not yet been provided as the RFM refresh address RFM_ADD. Accordingly, responsive to the RFM signal, the skip logic circuit 342 may activate the RFM refresh signal RFMR. In some embodiments, the RFMR signal may be provided to a refresh state control circuit, such as refresh state control circuit 228. If the RFM signal has been received more times than the Incr signal, it may indicate no aggressor rows have been identified since the previous RFM refresh operation. Accordingly, the skip logic circuit 342 may not activate the RFM refresh signal RFMR responsive to the RFM signal. This may cause the RFM refresh operation based on the number of access requests to he skipped.

Although the RFM signal provided by the access counter circuit 336 and the RFM refresh signal RFMR provided by the skip logic circuit 342 are described as separate signals, in some embodiments, the two may be considered the same signal and the skip logic circuit 342 selectively masks or blocks the active RFM signal based, at least in part, on the Incr signal.

Figure 4:
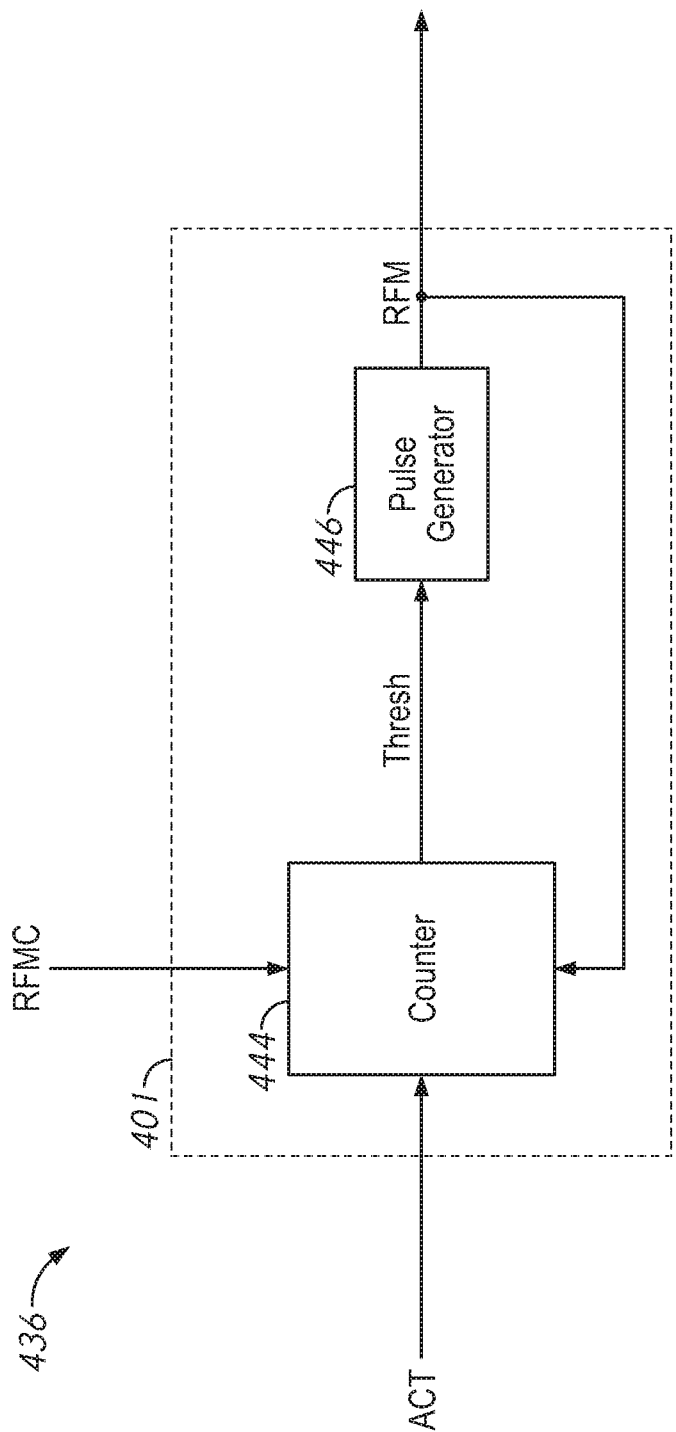
FIG. 4 is a block diagram of an access counter circuit according to an embodiment of the present disclosure.

FIG. 4 is a block diagram of an access counter circuit according to an embodiment of the present disclosure. The access counter circuit 436 may be used to implement access counter circuit 336. The access counter circuit 436 may include a counter 444 and a pulse generator 446 in some embodiments. In some embodiments, the access counter circuit 436 may be included with a memory controller 401. In some embodiments, memory controller 401 may be included in memory controller 301 and/or memory controller 101.

In some embodiments, the counter 444 may be a multi-bit counter that increments a count value each time an active activation signal ACT is received. When the multi-bit counter reaches its maximum value, the counter 444 may reset. The resetting of the counter 444 may activate refresh management signal RFM.

In some embodiments, such as the one shown in FIG. 4, the counter 444 may have a programmable threshold value, for example, by a RFM command signal RFMC. Each time an activation signal ACT is received, the count value may be incremented and compared to the threshold value. When the count value is found to be equal to the threshold value, the counter 444 may activate a threshold signal Thresh provided to a pulse generator 446. The pulse generator 446 may generate a pulse for an active RFM signal. The RFM signal may be provided to the counter 444. Responsive to an active RFM signal, the counter 444 may adjust the count value. Adjusting the count value may include resetting to an initial value (e.g., zero) in some embodiments.

After resetting and/or adjusting the count value responsive to the active RFM signal, the counter 444 may continue incrementing responsive to the active activation signal ACT. Although the counter 444 is described as incrementing by increasing the count value responsive to the activation signal ACT, the counter 444 may decrease the count value responsive to the activation signal ACT in some embodiments. For example, the counter 444 may count down from the threshold value to zero.

Figure 5:
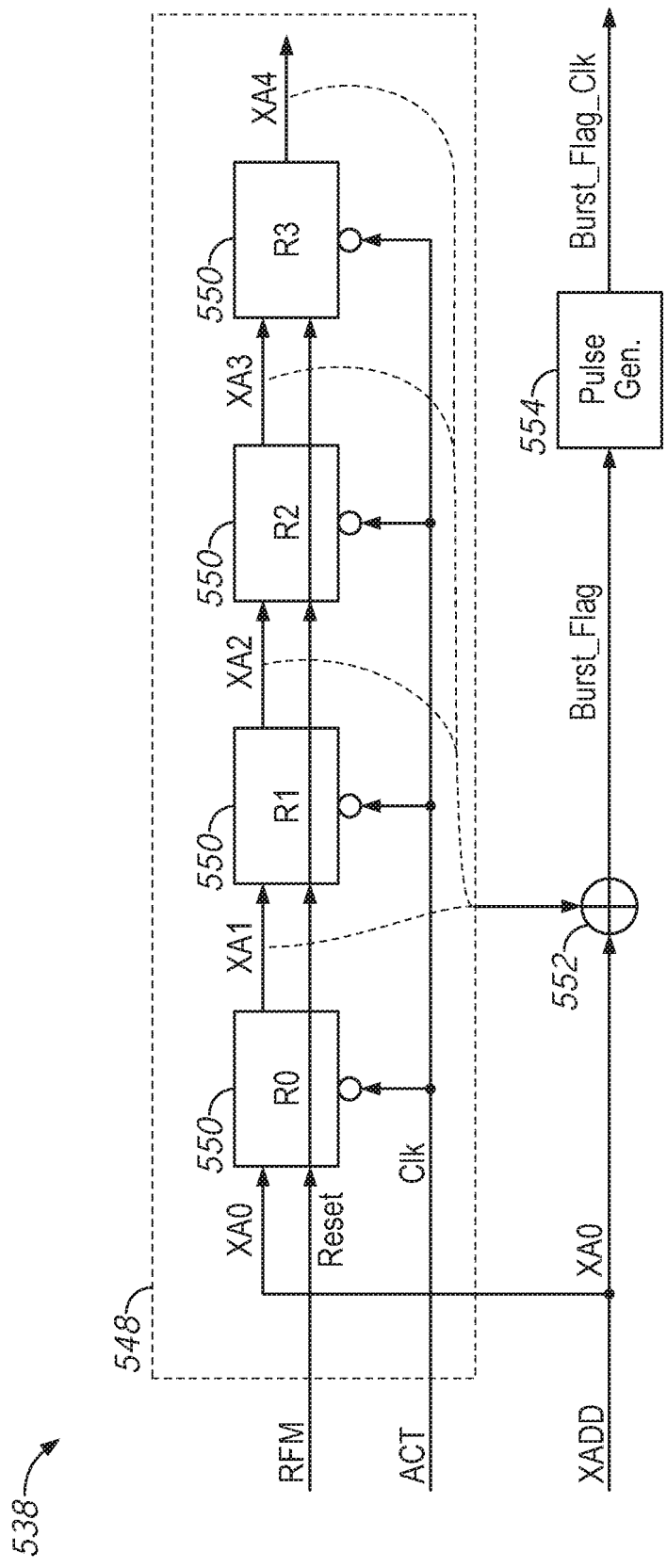
FIG. 5 is a block diagram of a burst detector circuit according to an embodiment of the present disclosure

FIG. 5 is a block diagram of a burst detector circuit according to an embodiment of the present disclosure. Burst detector circuit 538 may be used to implement burst detector circuit 338 in some embodiments. Burst detector circuit 538 may include a first-in-first-out (FIFO) circuit 548, a comparator circuit 552, and a pulse generator 554.

The FIFO circuit 548 may include multiple registers 550, labeled R0-R3. Each of the registers 550 may be configured to store a row address XADD. The FIFO circuit 548 may receive an activation signal ACT. The activation signal ACT may be received from a command decoder circuit, such as command decoder circuit 106. The activation signal ACT may act as a clock signal to control the contents of the FIFO circuit 548. Responsive to an active activation signal ACT, the FIFO circuit 548 may latch a current row address XADD (XA0) in register R0. A previously stored row address (XA1) may be shifted from register R0 to register R1. A previously stored row address (XA2) may be shifted from register R1 to register R2, and so on. The previously stored match address in the final register R4 may be discarded.

When a new row address XA0 is received, the row address XA0 is compared to the row addresses XA1-XA4 in the registers 550, R0-R3 by comparator circuit 552. If the row address XA0 matches (e.g., is the same as) one or more of the row addresses XA1-XA4 in the FIFO circuit 548, it may indicate that the row address XA0 is being received at a high frequency (e.g., at or above a cut-off frequency). That is, the word line associated with row address XA0 may be accessed via access requests at a high frequency/rate. Thus, the word line associated with row address XA0 may be an aggressor row. If the current row address XA0 matches (e.g., is the same as) one of the row addresses XA1-XA4 in the FIFO circuit 548, the comparator circuit 552 may activate the burst flag signal Burst_Flag. The Burst_Flag signal may be received by the pulse generator 554, which may activate a pulse signal burst flag clock signal Burst_Flag_Clk responsive to the active Burst_Flag signal. The Burst_Flag_Clk may indicate that an aggressor row has been identified by the burst detector circuit 538. In some embodiments, the Burst_Flag_Clk signal may be provided to a RFM address storage circuit, such as RFM address storage circuit 340. As disclosed herein, the Burst_Flag_Clk signal may cause the current row address XA0 to be stored by the RFM address storage circuit.

The FIFO circuit 548 may further receive a refresh management signal RFM from an access counter circuit, such as access counter circuit 436 and/or access counter circuit 336. In some embodiments, the RFM signal may act as a reset signal and clear the registers 550 of the FIFO circuit 548.

Although the FIFO circuit 548 is shown with four registers 550, more or fewer registers may be included in other embodiments. The burst detector circuit 538 may act as a digital high pass filter. Row addresses received at low frequencies may be "filtered out" whereas row addresses received at high frequencies may be "passed" by activating the Burst_Flag signal. In other words, row addresses received at a frequency below a cut-off frequency may be determined to not be aggressor rows whereas row addresses received at a frequency at or above the cut-off frequency may be determined to be an aggressor row.

The cut-off frequency may be defined, at least in part, by a row address being received more than once within N-number of sequential access requests, where N is the number of registers 550 in the FIFO circuit 548. By increasing the number of registers 550 in the FIFO circuit 548, the cut-off frequency decreases and lower frequency row addresses may be passed due in part to more prior row addresses being stored in the FIFO circuit 548. Thus, the chance of a row address in a register 550 matching the current row address XA0 increases. By decreasing the number of registers 550 in the FIFO circuit 548, the cut-off frequency increases and only higher frequency row addresses will be passed by the burst detector circuit 538. The value of the cut-off frequency of the FIFO circuit 548 in Hertz may depend, at least in part, on a frequency of access requests (e.g., activation signals) received by the burst detector circuit 538. Thus, in some embodiments, the frequency in terms of Hertz may vary if the frequency of access requests varies. However, the cut-off frequency based on receiving a row address more than once in a number of access requests may remain constant in some embodiments.

In the embodiment shown in FIG. 5, the FIFO circuit 548 latches the row address XADD responsive to every activation signal ACT. However, in other embodiments, the burst detector circuit 538 may include a sampling circuit that produces a sampling signal that triggers the FIFO circuit 548 rather than the activation signal ACT. In some embodiments, the sampling signal may be based, at least in part, on the activation signal ACT. The sampling signal may be non-random (e.g., periodic), random, or pseudo-random.

Figure 6:
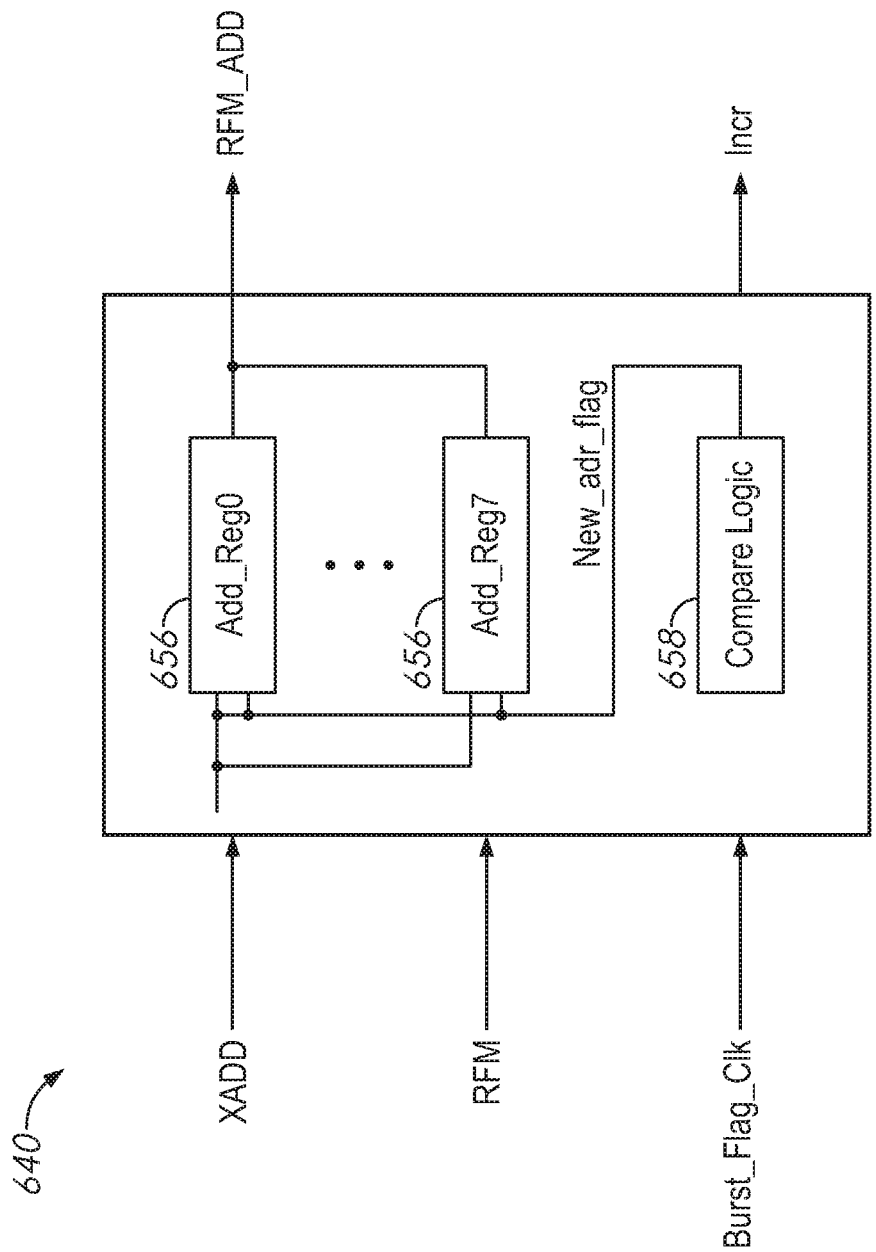
FIG. 6 is a block diagram of a refresh management address storage circuit according to an embodiment of the present disclosure

FIG. 6 is a block diagram of a refresh management address storage circuit according to an embodiment of the present disclosure. The RFIVI address storage circuit 640 may be included in RFM address storage circuit 340 in some embodiments. The RFM address storage circuit 640 may include multiple address registers 656 and a compare logic circuit 658. Although four address registers 656 ADD_Reg0-3 are shown in FIG. 6, in other embodiments, the address storage circuit 640 may include more or fewer address registers 656.

The RFM address storage circuit 640 may receive row addresses XADD and a burst flag clock signal Burst_Flag_Clk. The Burst_Flag_Clk signal may be received from a burst detector circuit, such as burst detector circuit 538 and/or 338. Responsive to an active Burst_Flag_Clk signal, the compare logic circuit 658 may compare the current row address XADD to the row addresses already stored in address registers 656. If the current row address XADD does not match any of the addresses stored in the address registers 656, the compare logic circuit 658 may activate a new address flag New_adr_flag signal provided to one of the address registers 656. Responsive to the active New_adr_flag signal, the corresponding address register 656 may store the current row address XADD. In some embodiments, the order in which the compare logic 658 causes the row addresses to be stored in the address registers 656 may be sequential. For example, responsive to a first Burst_Flag_Clk pulse, a row address may be stored in Add_Reg0. Responsive to a second Burst_Flag_Clk pulse, a row address may be stored in Add_Reg1, and so on. In other embodiments, the order in which the row addresses are stored in the address registers 656 may be random or pseudo-random. In some embodiments, each time a new address is stored in one of the registers 656, an active increment signal Incr may be provided by the RFM address storage circuit 640 to a skip logic circuit, such as skip logic circuit 342.

If the current row address XADD matches one of the row addresses already stored in the registers 656, the RFM address storage circuit 640 may not store (e.g., ignore) the current row address and the Incr signal may not be activated (e.g., remains inactive). In some embodiments, if all of the registers 656 are currently storing row addresses, the new address may be ignored, even if the new address does not match any of the addresses stored in the address registers 656. In this case the Incr signal may not be activated.

The RFM address storage circuit 640 may receive a refresh management signal RFM. The RFM signal may be provided by an access counter circuit, such as access counter circuit 436 and/or 336. Responsive to an active RFM signal, the RFM address storage circuit 640 may output an address from one of the address registers 656 as a RFM address RFM_ADD. In some embodiments, the RFM address RFM_ADD may be provided to a refresh address generator circuit, such as refresh address generator circuit 234. The order in which the addresses are provided from the address registers 656 may be sequential in some embodiments. For example, responsive to a first RFM pulse, the address stored in Add_Reg0 may be provided, Responsive to a second RFM pulse, the address stored in ADD_Reg1 may be provided, and so on. In some embodiments, the order in which the addresses are provided from the address registers 656 may be random or pseudo-random.

Figure 7:
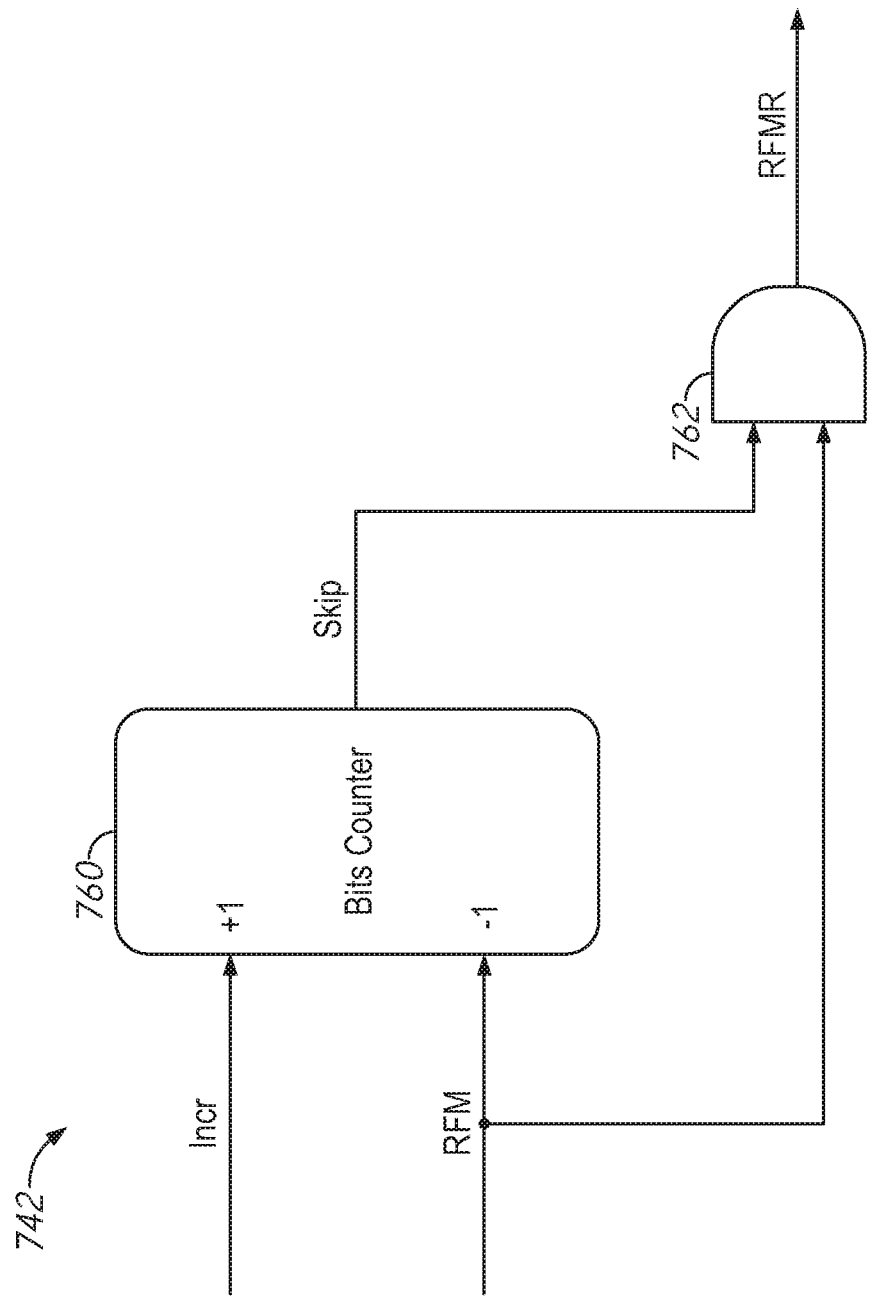
FIG. 7 is a block diagram of a skip logic circuit according to an embodiment of the present disclosure.

FIG. 7 is a block diagram of a skip logic circuit according to an embodiment of the present disclosure. Skip logic circuit 742 may be included in skip logic circuit 342 in some embodiments. The skip logic circuit 742 may include a bits counter 760 and a control logic circuit 762.

The bits counter 760 may receive an increment signal Incr from a RFM address storage circuit, such as RFM address storage circuit 640 and/or 340. When the bits counter 760 receives an active Incr signal, the bits counter 760 may increase a count value. The bits counter 760 may receive a refresh management signal RFM. When the bits counter 760 receives an active RFM signal, the bits counter 760 may decrease the count value. In some embodiments, the count value may not go below a minimum value (e.g., zero).

As noted in reference to FIG. 6, the increment signal Incr is activated responsive to a new row address stored in the RFM address storage circuit, Thus indicating that an RFM refresh operation may be required to refresh victim rows associated with the row address stored in the RFM address storage circuit. When an RFM signal is activated, it indicates that an RFM refresh operation is to be performed, and a row address will be provided from the RFM address storage circuit for generating refresh addresses. Thus, the RFM signal may indicate one less aggressor row address stored in the RFM address storage circuit requires an RFM refresh operation.

Accordingly, when the bits counter 760 has a value greater than the minimum value, such as zero, it may indicate that there are aggressor rows stored in the RFM address storage circuit to be handled by an RFM refresh operation. When the bits counter 760 has a value equal to the minimum value, it may indicate that all of the aggressor rows stored in the RFM address storage circuit have been provided to a refresh address generator circuit during one or more RFM refresh operations.

In some embodiments, when the bits counter 760 has a value greater than the minimum value, it may provide an inactive Skip signal. When the bits counter 760 has a value equal to the minimum value, it may provide an active Skip signal. The Skip signal and the RFM signal may be provided to control logic circuit 762 as an input. The control logic circuit 762 may also receive the RFM signal as an input. Based on the state of the Skip signal, the control logic circuit 762 may provide an active RFM refresh signal RI/MR responsive to an active RFM signal.

In the example shown in FIG. 7, the control logic circuit 762 includes an AND gate circuit. In this example, the Skip signal may be active low (e.g., low logic state). Thus, when the count value of the bits counter 760 is greater than the minimum value, the Skip signal may be high, and the control logic circuit 762 may provide an active RFM refresh signal RFMR responsive to an active RFM signal. When the count value of the bits counter 760 is equal to the minimum value, the Skip signal may below, and the control logic circuit 762 may keep RFM refresh signal RFMR inactive, even when an active RFM signal is received. Keeping the RFMR signal inactive may be referred to as masking and/or blocking the active RFM signal. The logic gates and signal states are provided only as an example. Other suitable logic circuits may be included in control logic circuit 762 and/or the Skip signal may be an active high signal in other embodiments.

Thus, by inhibiting the RFM signal when there are no new aggressor row addresses stored in the RFM address storage circuit, unnecessary RFM refresh operations may be reduced.

As disclosed herein, the RFM refresh operations performed by a memory device (e.g., device 100) may be controlled based, at least in part, on external commands. In some embodiments, the external commands (e.g., RFM commands) may be provided by a memory controller and/or a processor in communication with the memory device. In some applications, the RFM commands may permit greater control over refresh operations as auto- and targeted refresh operations are typically controlled by commands internal to the memory device. For example, in addition to being able to indicate that an RFM refresh operation should be performed for a number of access requests, RFM commands may indicate how many RFM refresh operations are performed once the number of access requests reached a threshold value.

In some embodiments, a single RFM refresh operation may be performed when a number of access requests reaches a threshold value. This may be referred to as "distributing" the RFM refresh operations. In other embodiments, multiple RFM refresh operations may be performed. In some embodiments, when multiple RFM refresh operations are performed once a number of access requests has been reached, the threshold value may be greater than when a single RFM refresh operation is performed. This may be referred to as "postponing" the RENE refresh operations.

Figure 8:
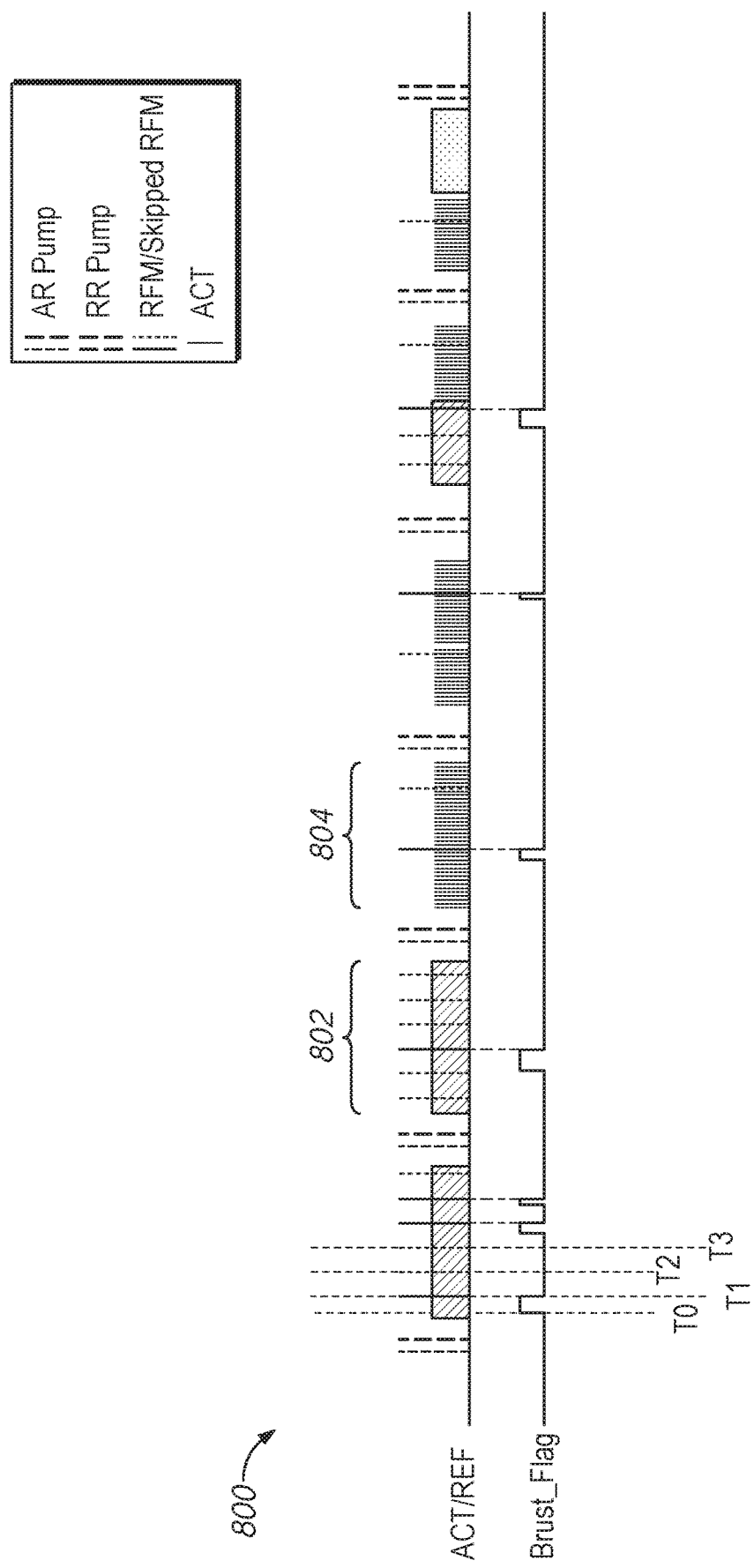
FIG. 8 is a timing diagram of a distributed refresh management technique according to an embodiment of the present disclosure.

FIG. 8 is a timing diagram of a distributed refresh management technique according to an embodiment of the present disclosure. The timing diagram 800 may illustrate the states of signals of a memory device, such as memory device 100. The first line of timing diagram 800 illustrates the relative timing of activation commands ACT, which may correspond to access requests, and various refresh operations. The activation commands ACT are shown as shorter, thinner lines. However, densely spaced activation commands (e.g., high frequency) are shown as blocks filled in with diagonal lines. Periods of sparse activation commands (e.g., few or none) are shown as blocks filled with dots. Auto-refresh operations are illustrated as taller, dashed lines. Targeted refresh operations are illustrated as taller, thicker dashed lines. RFM refresh operations are illustrated as taller lines, except when an RFM operation is skipped, it is shown as a dotted line.

Auto-refresh and/or targeted refresh operations may be performed during periodic refresh modes (e.g., based on a periodic signal such as AREF). In some embodiments, such as the one shown in FIG. 8, the memory device may perform a "double pump" refresh operation during a refresh mode. In the example shown in FIG. 8, a first pump may cause an auto-refresh operation to be performed and a second pump may cause a targeted refresh operation to be performed. In some embodiments, periodically, both pumps may cause targeted refresh operations to be performed.

In contrast to auto-refresh and targeted refresh operations, RFM refresh operations may be performed responsive to a number of activation commands ACT, rather than being periodic based on time. In some embodiments, the activation commands may be counted by an access counter circuit, such as access counter circuit 336 and/or 436, and the access counter circuit may provide a signal (not shown in FIG. 8) that indicates a RFM refresh operation should be performed once the count value reaches a threshold value. Thus, as shown in FIG. 8, RFM refresh operations are more closely spaced in time during periods of a high rate of activation commands ACT (e.g., period 802) compared to periods of a low rate of activation commands ACT (e.g., period 804).

The second line of timing diagram 800 illustrates a state of a burst flag Burst_Flag signal. The Burst_Flag signal may be provided by a portion of a burst detector, for example, the comparator circuit 552 of burst detector circuit 538. As described with reference to FIG. 5, the Burst_Flag may transition to an active state (e.g., a high state in the example shown in FIG. 8) responsive to determining a current row address matches a previously received row address stored in the burst detector (e.g,, in FIFO circuit 548). This may indicate that the row address is being received at a frequency at or above a cut-off frequency and corresponds to an aggressor row. The burst flag Burst_Flag may transition to an inactive state (e.g., a low state in the example shown in FIG. 8) responsive, at least in part, to a RFM refresh operation being performed.

As shown in FIG. 8, at or around a time T0, the burst detector determines a row address corresponds to an aggressor row and the Burst_Flag transitions to an active state. Once a number of activation commands ACT reaches a threshold value, an RFM refresh operation is performed at or around a time T1. The RFM refresh operation may be performed responsive to a skip logic circuit, such as skip logic circuit 342 and/or 742, providing an active RFM refresh signal RFMR, responsive, at least in part, to the active Burst_Flag provided by the burst detector, for example, as described with reference to FIGS. 5-7, Responsive, at least in part, to the RFM refresh operation, the Burst_Flag may transition to an inactive state at or around time T1.

The access counter circuit may continue to count the number of activation commands ACT received after the RFM refresh operation is performed at or around time T1. The threshold value may be reached again at or around time T2. However, during the time between the RFM refresh operation and when the threshold value is reached again, the burst detector may not detect an aggressor row. That is, all of the row addresses associated with the activation commands ACT may have been received at a low frequency, and thus low risk for being aggressor rows. Accordingly, the Burst_Flag signal may remain low, and the skip logic circuit may maintain the RFMIR signal in an inactive state. As shown by the dashed lines at or around time T2, the UM refresh operation may not be performed (e.g., skipped) despite the access counter circuit having reached the threshold value. The same situation occurs at or around time T3, and yet another RFM refresh operation is skipped.

As shown in FIG. 8, the Burst_Flag signal may remain active for a variable amount of time. The width of the pulse of the Burst_Flag signal may be based on how soon after the previous RFM refresh operation (or scheduled RFM refresh operation) an aggressor row was detected.

While the RFM circuitry described with reference to FIGS. 3-7 may be used to implement the distributed refresh management technique shown in FIG. 8, in some embodiments, an alternative embodiment of the RFM circuitry may be used.

Figure 9:
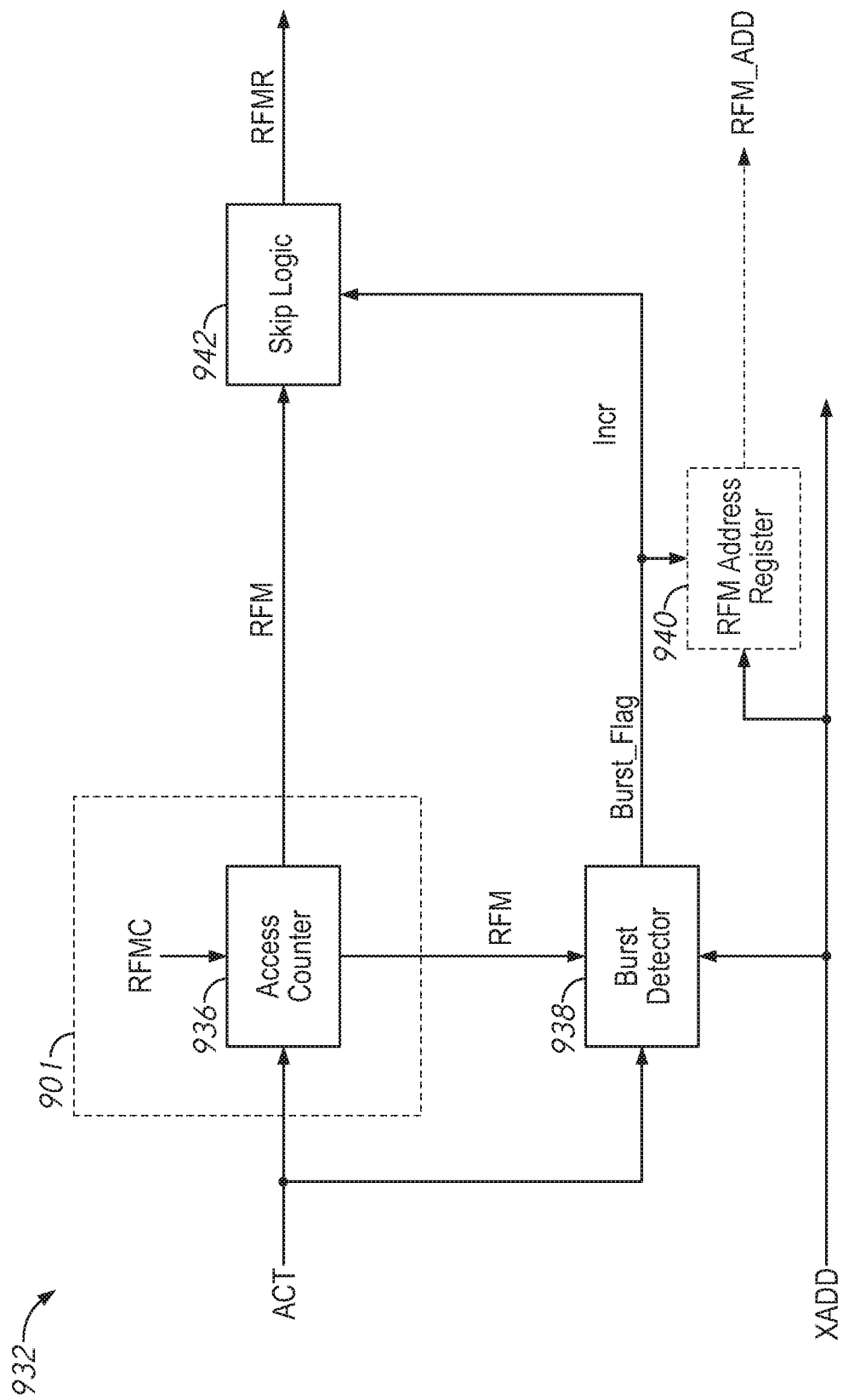
FIG. 9 is a block diagram of an example of simplified UM circuitry according to an embodiment of the present disclosure.

FIG. 9 is a block diagram of an example of RFM circuitry according to an embodiment of the present disclosure. In some embodiments, the simplified RFM circuitry 932. may be included in RFM circuitry 232. The simplified RFM circuitry 932 may include an access counter circuit 936 (which may be included in a memory controller 901 in some embodiments), a burst detector circuit 938, and a skip logic circuit 942. In some embodiments, the access counter circuit 436 may be used to implement the access counter circuit 932.

In some embodiments, the burst detector circuit 938 may be equivalent to the burst detector 538 except that the pulse generator 554 may be omitted and the burst detector 938 may provide the burst flag signal Burst_Flag rather than the burst flack clock signal Burst_Flag_,C1k. The skip logic circuit 942 may receive the RFM signal from the access counter circuit 936 and the Burst_Flag from the burst detector 938. The skip logic circuit 942 may include appropriate logic gates (e.g., an AND gate circuit) such that the skip logic circuit 942 provides an active RFM refresh signal RFMR when the Burst_Flag signal and the RFM signal are active. In some embodiments, a refresh address generator circuit, such as refresh address generator circuit 234, may be configured to use the current row address XADD as the RFM address RFM_ADD during an RFM refresh operation. In other embodiments, the RFM circuitry 932 may optionally further include an RFM address register 940 configured to latch the row address XADD responsive to the active Burst_Flag signal.

Figure 10:
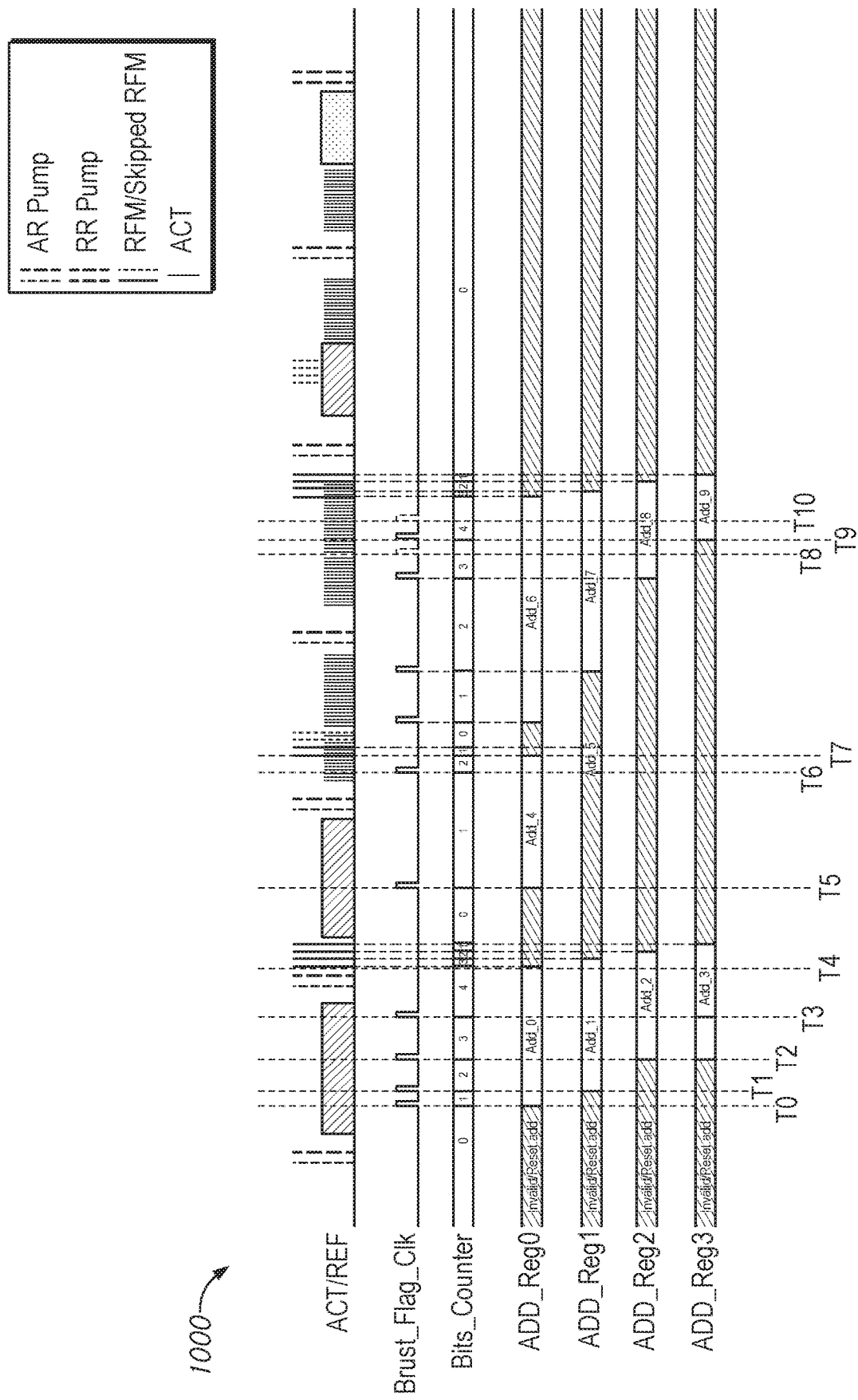
FIG. 10 is a timing diagram of a postponed distributed refresh management technique according to an embodiment of the present disclosure.

FIG. 10 is a timing diagram of a postponed distributed refresh management technique according to an embodiment of the present disclosure. The timing diagram 1000 may illustrate the states of signals of a memory device, such as memory device 100. In some embodiments, the memory device may include RFM circuitry, such as RFM circuitry 332, which may be implemented by the circuits described with reference to FIGS. 4-7 in some embodiments.

The first line of timing diagram 1000 illustrates the relative timing of activation commands ACT, which may correspond to access requests, and various refresh operations. The activation commands ACT are shown as shorter, thinner lines. However, densely spaced activation commands (e.g., high frequency) are shown as blocks filled in with diagonal lines. Periods of sparse activation commands (e.g., few or none) are shown as blocks filled with dots. Auto-refresh operations are illustrated as taller, dashed lines. Targeted refresh operations are illustrated as taller, thicker dashed lines. RFM refresh operations are illustrated as taller lines, except when an RFM operation is skipped, it is shown as a dotted line. The refresh operations shown in FIG. 10 may be performed in substantially the same manner as described with reference to FIG. 8 in some embodiments. However, for RFM refresh operations, when a count value reaches a threshold value, rather than a single RFM refresh operation, four RFM refresh operations are performed. Four RFM refresh operations are provided solely for illustrative purposes, and any number of RFM refresh operations may be performed in some embodiments.

The second line of timing diagram 1000 illustrates a burst flag clock signal Burst_Flag_Clk, which may be provided by a burst detector circuit, such as burst detector circuit 538. The third line of timing diagram 1000 illustrates a value of a bits counter of a skip logic circuit, such as bits counter 760 of skip logic circuit 7422. The remaining lines of timing diagram 1000 illustrate the states of address registers ADD_Reg0-3 of an RFM address storage circuit, such as address storage circuit 640. In some embodiments, such as the one shown in FIG. 10, the number of address registers used in the RFM address storage circuit may be selected to match a number of RFM refresh operations performed responsive to an active RFM refresh signal RFMR (not shown in FIG. 10).

At or around a time T0, the Burst_Flag_Clk signal transitions to provides an active pulse responsive to the burst detector determining that a row address corresponds to an aggressor row. Responsive to the Burst_Flag_Clk pulse, one of the address registers, ADD_Reg0, stores the current row address Add_0. The RFM address storage circuit may provide an active increment signal (not shown in FIG. 10) to the skip logic circuit. Responsive to the increment signal, the bits counter may increment a value stored therein. In the examples shown, the value is incremented from zero to one.

At or around a time T1, the Burst_Flag_Clk signal transitions to provide an active pulse responsive to the burst detector determining another row address corresponds to an aggressor row. Responsive to the Burst_Flag_Clk pulse, one of the address registers, ADD_Reg1, stores the current row address Add_1. The RFM address storage circuit may provide an active increment signal to the skip logic circuit, which in response increments the value of the bits counter from 1 to 2.

At or around a time T2, the Burst_Flag_Clk signal transitions to provide an active pulse responsive to the burst detector determining another row address corresponds to an aggressor row. Responsive to the Burst_Flag_Clk pulse, one of the address registers, ADD_Reg3, stores the current row address Add_2. The RFM address storage circuit may provide an active increment signal to the skip logic circuit, which in response increments the value of the bits counter from 2 to 3.

At or around a time T3, the Burst_Flag_Clk signal transitions to provide an active pulse responsive to the burst detector determining another row address corresponds to an aggressor row. Responsive to the Burst_Flag_Clk pulse, one of the address registers, ADD_Reg3, stores the current row address Add_3. The UM address storage circuit may provide an active increment signal to the skip logic circuit, which in response increments the value of the bits counter from 3 to 4.

At or before a time T4, a threshold value for a number of activation commands ACT may be reached. Because the bits counter has a value greater than zero (e.g., four), an active RFM refresh signal RFMR (not shown in FIG. 10), may be provided to a refresh state controller circuit, such as refresh state controller circuit 228, and RFM refresh operations may be performed by the memory device beginning at or around time T4.

Responsive to a first RFM refresh operation, the address stored in ADD_Reg0 may be provided to a refresh address generator circuit, such as refresh address generator circuit 234, and the value of the bits counter may be decreased from 4 to 3. Because the value of the bits counter is still greater than zero, the active RFM refresh signal RFMR may be provided. Responsive to a second RFM refresh operation, the address stored in ADD_Reg1 may be provided to the refresh address generator circuit, and the value of the bits counter may be decreased from 3 to 2. The same process occurs for the third and fourth RFM refresh operations. After the fourth RFM refresh operation is completed, the value of the bits counter has returned to zero and all of the registers ADD_Reg0-3 are empty (e.g., do not contain valid data). In some embodiments, a count value of an access counter may be reset, and counting may continue from the reset value (e.g., zero or the threshold value if the access counter counts down), At or around a time T5, the Burst_Flag_Clk signal transitions to provide an active pulse responsive to the burst detector determining another row address corresponds to an aggressor row. Responsive to the Burst_Flag_Clk pulse, one of the address registers, ADD_Reg0, stores the current row address Add_4. The RFM address storage circuit may provide an active increment signal to the skip logic circuit, which in response increments the value of the bits counter from 0 to 1.

At or around a time T6, the Burst_Flag_Clk signal transitions to provide an active pulse responsive to the burst detector determining another row address corresponds to an aggressor row. Responsive to the Burst_Flag_Clk pulse, one of the address registers, ADD_Reg1, stores the current row address Add_5. The RFM address storage circuit may provide an active increment signal to the skip logic circuit, which in response increments the value of the bits counter from 1 to 2.

At or before a time T7, the threshold value for the number of activation commands ACT may be reached. Because the bits counter has a value greater than zero (e.g., 2), an active RFM refresh signal RFMR, may be provided to a refresh state controller circuit, and RFM refresh operations may be performed by the memory device beginning at or around time T7.

Responsive to a first RFM refresh operation, the address stored in ADD_Reg0 may be provided to a refresh address generator circuit, and the value of the bits counter may be decreased from 2 to 1. Because the value of the bits counter is still greater than zero, the active RFM refresh signal RFMR may be provided. Responsive to a second RFM refresh operation, the address stored in ADD_Reg1 may be provided to the refresh address generator circuit, and the value of the bits counter may be decreased from 1 to 0. However, because the bits counter now has a value of zero, unlike in the previous set of RFM refresh operations at time T4, the active RFM refresh signal RFMR is not provided by the skip logic circuit. Accordingly, two of the four RFM refresh operations are not performed (e.g., skipped).

At or around a time T8, when three of the four address registers ADD_Reg0-2 are storing previously detected aggressor row addresses, the burst detector issues an active Burst_Flag_Clk signal. However, in this case, the RFM address storage circuit determines the current row address at or around time 18 is an address that is already stored in one of the registers ADD_Reg0-2. Accordingly, the address is not stored (e.g., ignored), and the value of the bits counter is not incremented (e.g., remains at three).

At or around a time T9, the Burst_Flag_Clk signal transitions to provide an active pulse responsive to the burst detector determining another row address corresponds to an aggressor row. This time, it is determined that the current row address is not stored in one of the address registers ADD_Reg0-2, and ADD_Reg3, stores the current row address Add_9.

At or around a time T10, the Burst_Flag_Clk signal transitions to provide an active pulse responsive to the burst detector determining another row address corresponds to an aggressor row. However, all of the address registers ADD_Reg0-3 are currently storing previously detected aggressor row addresses and the address is not stored. The value of the bits counter is not incremented. Accordingly, in some embodiments, not all identified aggressor rows may be addressed by RFM refresh operations in some applications, In some embodiments, the threshold value of the access counter may be selected to reduce the risk of missing aggressor row addresses identified by the burst detector.

Figure 11:
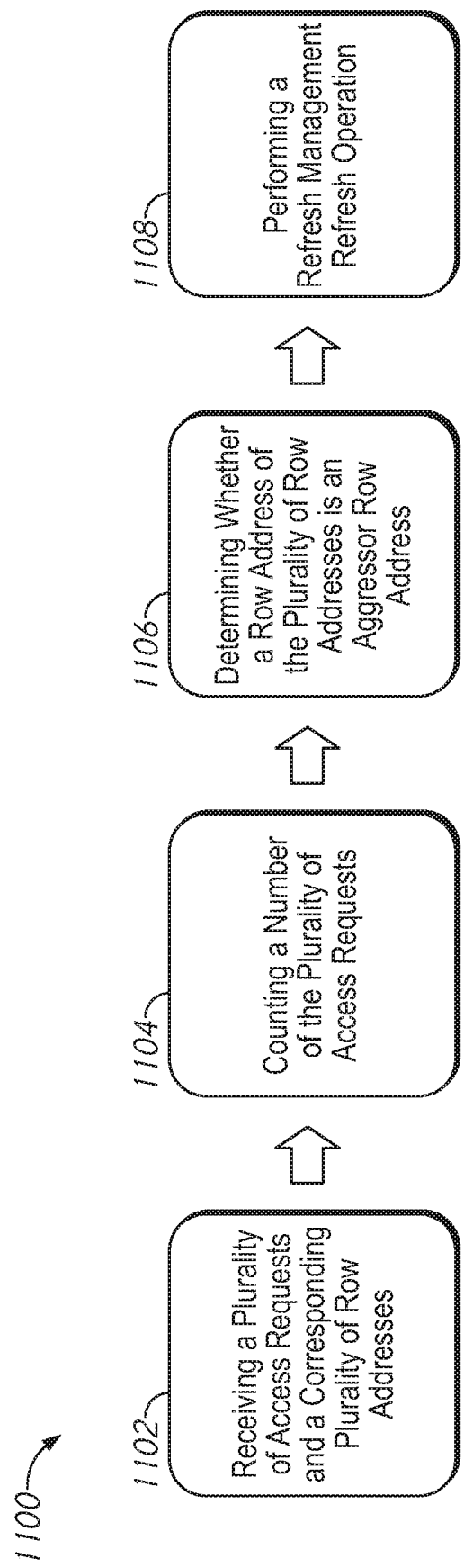
FIG. 11 is a flowchart of a method according to an embodiment of the present disclosure.

FIG. 11 is a flowchart of a method according to an embodiment of the present disclosure. In some embodiments, the method 1100 may be performed by a memory device, such as memory device 100.

At block 1102, "receiving a plurality of access requests and a corresponding plurality of row addresses" may be performed. The access requests and row addresses may be received by the memory device by a command address input circuit, such as command address input circuit 102. At block 1104, "counting a number of the plurality of access requests" may be performed. .1n some embodiments, the counting may be performed by an access counter circuit such as access counter circuit 336, 436, and/or 936. In some embodiments, the counting may be performed by a memory controller, such as memory controller 101, 301, 401, and/or 901.

At block 1106, "determining whether a row address of the plurality of row addresses is an aggressor row address." In some embodiments, determining whether a row address is an aggressor row address may be based, at least in part, on a frequency with which the row address is received by the memory. For example, the row address may be determined to be an aggressor row when the frequency is equal to or greater than a cut-off frequency of a high-pass filter. In some embodiments, the cut-off frequency may be selected based on a frequency of accessing a word line associated with the row address at which data in word lines physically adjacent to the word line are at risk of data degradation. In some embodiments, the determining may be performed by a burst detector circuit, such as burst detector circuit 338, 538, and/or 938. In some embodiments, the row address is determined to be an aggressor row when the row address matches at least one previously received row addresses stored in a register of the burst detector of the memory.

At block 1108, "performing a refresh management refresh operation" may be performed. The RFM refresh operation may be performed responsive to a refresh management refresh signal, which may be provided responsive to the number of the plurality of access requests equaling a threshold value and the determination that the row address is an aggressor row address. In some embodiments, the refresh management refresh signal may be an external command/signal provided by the memory controller. In some embodiments, the refresh management refresh operation may be performed, or at least caused to be performed, by a refresh control circuit, such as refresh control circuit 116 and/or 216. In some embodiments, the RFM refresh operation is skipped when the row addresses received by the memory are each received at a low frequency, frequencies below the cut-off frequency. That is, the row addresses are received at frequencies that do not put the data stored in word lines physically adjacent to the word lines corresponding to the row addresses at an increased risk of data degradation. In some embodiments, the RFM refresh operation is skipped responsive to a skip logic circuit, such as skip logic circuit 342, 742, and/or 942 masking an active RFM refresh signal.

The systems, methods, and apparatuses disclosed herein may allow for monitoring row addresses provided with associated access requests to determine whether one or more row addresses are accessed at a high frequency (e.g., at or above a cut-off frequency of a high-pass frequency), which may indicate the row addresses are associated with aggressor rows, if none of the row addresses associated with access requests are determined to be provided at a high frequency (e.g., not determined to be an aggressor row), an RFM refresh operation may be skipped. This may reduce unnecessary refresh operations in some applications.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a burst detector circuit configured to determine whether a current row address received by a memory is an aggressor row address when the current row address is received at a frequency equal to or greater than a cut-off frequency, wherein the burst detector circuit is configured to compare the current row address to one or more previously received row addresses, wherein the burst detector circuit is configured to provide an active flag when the current row address matches one or more of the previously received row addresses, wherein the burst detector circuit comprises:
a pulse generator configured to provide the active flag as a pulse signal:
a first-in-first-out circuit comprising a plurality of registers each configured to store one of the previously received row addresses; and
a comparator circuit configured to compare the current row address with the previously received row addresses and provide an active burst flag to the pulse generator when the current row address matches one of the previously received row addresses, wherein the pulse generator is configured to provide the active flag as the pulse signal responsive to the active burst flag: and
a skip logic circuit configured to pass an active refresh management refresh signal responsive, at least in part, to determination of the aggressor row address, wherein the active refresh management refresh signal causes a refresh operation to be performed by the memory outside a refresh mode.

2. The apparatus of claim 1, further comprising an access counter circuit configured to count a number of access commands and provide the active refresh management refresh signal when the number of access commands reaches a threshold value.

3. The apparatus of claim 2, wherein the access counter circuit comprises:
a counter circuit configured to adjust a count value responsive to the access commands; and
a pulse generator circuit, wherein the pulse generator circuit is configured to provide the active refresh management refresh signal as a pulse signal when the count value reaches the threshold value.

4. An apparatus comprising:
a burst detector circuit configured to determine whether a current row address received by a memory is an aggressor row address when the current row address is received at a frequency equal to or greater than a cut-off frequency, wherein the burst detector circuit is configured to compare the current row address to one or more previously received row addresses, wherein the burst detector circuit is configured to provide an active flag when the current row address matches one or more of the previously received row addresses;
a skip logic circuit configured to pass an active refresh management refresh signal responsive, at least in part, to determination of the aggressor row address wherein the active refresh management refresh signal causes a refresh operation to be performed by the memory outside a refresh mode; and
an address storage circuit configured to store the current row address responsive to the active flag and provide an active increment signal, wherein the address storage circuit comprises:
a plurality of address registers; and
a comparator circuit configured to, responsive to the active flag, compare the current row address to row addresses stored in the plurality of address registers, wherein the comparator circuit is configured to cause the current row address to be stored in one of the plurality of address registers when the current row address does not match the row addresses stored in the plurality of address registers and at least one of the plurality of address registers is not storing a row address.

5. The apparatus of claim 4, wherein the skip logic circuit comprises a bits counter, wherein a value of the bits counter is increased responsive to the active increment signal and the value of the bits counter is decreased responsive to the refresh management refresh signal, wherein the skip logic circuit is configured to pass the refresh management refresh signal when the value of the bits counter is greater than a minimum value.

6. A system comprising:
a memory controller configured to count a number of activation commands received by the memory and provide an active refresh signal when the number of activation commands equals a threshold value; and
a memory comprising:
a burst detector configured to determine whether a row address received by a memory is an aggressor row address and provide an active burst flag responsive to the aggressor row address;
a skip logic circuit configured to pass the active refresh signal responsive to the active burst flag and to mask the active refresh signal when the burst flag is inactive;
an address register configured to store the row address responsive to the active burst flag. wherein the address register is configured to provide the row address when the skip logic circuit passes the active refresh signal;
a refresh state controller circuit configured to provide a refresh operation type signal to cause a refresh management refresh operation to be performed when the active refresh signal is received from the skip logic circuit; and
a refresh address generator circuit configured to generate a refresh address based, at least in part, on the row address provided from the address register responsive to the refresh operation type signal indicating the refresh management refresh operation.

7. The system of claim 6, wherein the refresh address corresponds to a word line physically adjacent to the row address provided from the address storage circuit.

8. A system comprising:
a memory controller configured to count a number of activation commands received by the memory and provide an active refresh signal when the number of activation commands equals a threshold value: and
a memory comprising:
a burst detector configured to determine whether a row address received by a memory is an aggressor row address and provide an active burst flag responsive to the aggressor row address, wherein the burst detector comprises:
a first-in-first-out (FIFO) circuit comprising a plurality of registers configured to store row addresses received by the memory; and
a comparator circuit configured to provide the active burst flag when the row address matches at least one of the row addresses stored in the plurality of registers; and
a skip logic circuit configured to pass the active refresh signal responsive to the active burst flag and to mask the active refresh signal when the burst flag is inactive.

9. The system of claim 8, wherein the FIFO circuit is configured to be reset by the active refresh signal provided by the memory controller.

10. The system of claim 8, wherein the FIFO circuit is a high-pass filter, wherein a cut-off frequency of the high-pass filter is based, at least in part, on a number of the plurality of registers.

11. A method comprising:
receiving a plurality of access requests from a memory controller and a corresponding plurality of row addresses by a memory;
storing the plurality of row addresses in a plurality of registers of a first-in-first-out (FIFO) circuit of a burst detector circuit;
determining, with a comparator circuit, whether a row address of the plurality of row addresses is an aggressor row address based, at least in part. on whether the row address matches at least one of the plurality of row addresses stored in the plurality of registers;
providing, from the comparator circuit, an active burst flag when the row address matches at least one of the plurality of row addresses stored in the plurality of registers;
performing a refresh management refresh operation responsive to an external refresh management signal and the active burst flag; and
skipping the refresh management refresh operation when the burst flag is inactive.

12. The method of claim 11, wherein the FIFO circuit comprises a high-pass filter having a cut-off frequency, wherein the refresh management refresh operation is skipped when the plurality of row addresses are each received at a frequency below the cut-off frequency.

13. The method of claim 12, wherein the frequency is equal to or greater than the cut-off frequency when the row address of the plurality of row addresses matches at least one of a plurality of previously received row addresses stored in the plurality of registers.

14. The method of claim 11, wherein the external refresh management signal is provided responsive, at least in part, to receiving a number of access requests at the memory.

\* \* \* \* \*